US008575917B2

(12) United States Patent
Sims et al.

(10) Patent No.: US 8,575,917 B2
(45) Date of Patent: Nov. 5, 2013

(54) MULTIRANGE LOAD DETECTION CIRCUITRY (75) Inventors: Nicholas A. Sims, San Francisco, CA (US); Jeffrey J. Terlizzi, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 339 days.

(21) Appl. No.: 12/566,593

(22) Filed: Sep. 24, 2009

(65) Prior Publication Data
US 2011/0068819 A1    Mar. 24, 2011

(51) Int. Cl.
G01R 19/18    (2006.01)

(52) U.S. Cl.
USPC .......................................................... 324/120

(58) Field of Classification Search
USPC .......................................................... 324/771
See application file for complete search history.

(56) References Cited

U.S. PATENT DOCUMENTS

| | | | |
|---|---|---|---|
| 3,723,815 A | 3/1973 | Ambler et al. | |
| 4,205,306 A | 5/1980 | Turlej | |
| 4,211,933 A | 7/1980 | Hedges et al. | |
| 4,213,058 A | 7/1980 | Townsend | |
| 4,245,319 A | 1/1981 | Hedges | |
| 4,324,987 A | 4/1982 | Sullivan et al. | |
| 4,336,462 A | 6/1982 | Hedges et al. | |
| 4,471,232 A | 9/1984 | Peddie et al. | |
| 4,553,081 A * | 11/1985 | Koenck | 320/131 |
| 4,574,266 A * | 3/1986 | Valentine | 340/635 |
| 4,819,180 A | 4/1989 | Hedman et al. | |
| 5,612,609 A | 3/1997 | Choi | |
| 5,642,267 A | 6/1997 | Brkovic et al. | |
| 5,737,706 A | 4/1998 | Seazholtz et al. | |
| 6,046,513 A | 4/2000 | Jouper et al. | |
| 6,125,048 A | 9/2000 | Loughran et al. | |
| 6,215,288 B1 | 4/2001 | Ramsey et al. | |
| 7,030,596 B1 | 4/2006 | Salerno et al. | |
| 7,170,194 B2 | 1/2007 | Korcharz et al. | |
| 7,404,091 B1 | 7/2008 | Gere | |
| 7,482,708 B1 * | 1/2009 | Barton et al. | 307/30 |
| 8,164,932 B2 * | 4/2012 | Sims et al. | 363/69 |
| 8,232,775 B2 * | 7/2012 | Eastlack | 320/140 |
| 2003/0011486 A1 | 1/2003 | Ying | |
| 2006/0095164 A1 | 5/2006 | Donnelly et al. | |
| 2006/0214510 A1 | 9/2006 | Patel | |

(Continued)

OTHER PUBLICATIONS

Terlizzi et al., U.S. Appl. No. 12/239,345, filed Sep. 26, 2008.
Sims et al., U.S. Appl. No. 12/370,488, filed Feb. 12, 2009.
Terlizzi et al., U.S. Appl. No. 12/566,594, filed Sep. 24, 2009.

*Primary Examiner* — Thomas Valone
(74) *Attorney, Agent, or Firm* — Womble Carlyle Sandridge & Rice LLP (57) ABSTRACT Load detection circuitry is provided that may be used to monitor an output line. The load detection circuitry may include one or more current sensing resistors. A monitor circuit can measure voltages across the current sensing resistors to determine whether current is flowing through a load connected to the output line. In configurations with multiple different current sensing resistors, the monitor circuit can determine the amount of current that is flowing through the load based on the measured voltages. A switch may be interposed between the current sensing resistor and the output line. A current-limited voltage regulator may supply a voltage to the output line. The monitor circuit may periodically open the switch and monitor resulting voltage changes on the output line to determine whether an electronic device or other load is attached. Opening of the switch may be inhibited whenever current is sensed through a current sensing resistor.

13 Claims, 6 Drawing Sheets

(56) References Cited

U.S. PATENT DOCUMENTS

| | | |
|---|---|---|
| 2007/0070558 A1 | 3/2007 | Liu |
| 2010/0001685 A1* | 1/2010 | Eastlack ............... 320/108 |
| 2010/0202161 A1* | 8/2010 | Sims et al. ............. 363/20 |
| 2011/0068626 A1* | 3/2011 | Terlizzi et al. ............. 307/32 |
| 2011/0128153 A1* | 6/2011 | Sims et al. ............. 340/636.1 |
| 2012/0069609 A1* | 3/2012 | Christophe et al. ........ 363/21.12 |
| 2012/0176823 A1* | 7/2012 | Sims et al. ............. 363/69 |

* cited by examiner

MULTIRANGE LOAD DETECTION CIRCUITRY

BACKGROUND

This relates to load detection circuits and, more particularly to multirange load detection circuitry.

It is sometimes desirable to measure the impact of a load on an electronic circuit. For example, a power converter circuit may include load detection circuitry that determines whether or not an electronic device is plugged into the power converter.

Power converter circuitry can be used to convert alternating current (AC) power into direct current (DC) power. AC power is typically supplied from wall outlets and is sometimes referred to as line power. Electronic devices include circuitry that runs from DC power. The DC power that is created by an AC-to-DC power converter may be used to power an electronic device. The DC power that is created may also be used to charge a battery in an electronic device.

In some applications, AC to DC power converter circuitry may be incorporated into an electronic device. For example, desktop computers often include AC to DC power converter circuitry in the form of computer power supply units. A computer power supply unit has a socket that receives an AC power cord. With this type of arrangement, the AC power cord may be plugged directly into the rear of the computer to supply AC power without using an external power converter.

Although desktop computers are large enough to accommodate internal power supplies, other devices such as handheld electronic devices and portable computers are not. As a result, typical handheld electronic devices and laptop computers require the use of external power converters. When untethered from the power converter, a handheld electronic device or portable computer may be powered by an internal battery. When AC line power is available, the power converter is used to convert AC power into DC power for the electronic device.

Compact AC-DC power converter designs are typically based on switched-mode power supply architectures. Switched-mode power converters contain switches such as transistor-based switches that work in conjunction with energy storage components such as inductive and capacitive elements to regulate the production of DC power from an AC source. A feedback path may be used to tap into the converter output and thereby ensure that a desired DC voltage level is produced under varying loads.

High power converter efficiency is desirable for conserving power. High power conversion efficiency can be obtained by using efficient converter topologies and low-loss parts. Even when an optimal design is used, however, there are residual power losses when operating a power converter. These residual losses are associated with leakage currents and other parasitics that arise from running the switched-mode circuitry of the converter and lead to the consumption of power by the power converter even when the power converter is not being actively used to power an electronic device. Power consumption when the power converter is not being used to power an electronic device represents a source of undesirable power loss that can be reduced without adversely affecting converter functionality.

SUMMARY

Load detection circuitry is provided that may be used to monitor an output line. The load detection circuitry may include one or more current sensing resistors. A monitor circuit can measure voltages across the current sensing resistors to determine whether current is flowing through a load connected to the output line. In configurations with multiple different current sensing resistors, the monitor circuit can determine how much current is flowing through the load based on the measured voltages.

A switch may be interposed between the current sensing resistor circuitry and the output line. A current-limited voltage regulator may supply a voltage to the output line. The monitor circuit may periodically open the switch and measure resulting voltage changes on the output line to determine whether an electronic device or other load is attached. Opening of the switch may be inhibited whenever current has already been sensed using a current sensing resistor.

The load detection circuitry may measure currents in a first range using the current sense resistor and may measure currents in a second range using the switch, current-limited voltage regulator, and monitor circuit. The first range may be larger than the second range. Currents in additional ranges may be monitored using additional parallel current sensing resistors.

The load detection circuitry may be used to measure the currents drawn by any suitable load. For example, the load detection circuitry may be used in a power converter to detect when an electronic device is attached to the power converter.

The power converter may include an energy storage circuit. The power converter may receive an input signal such as a line power signal and may produce a corresponding output signal such as a power signal on the output line. The power converter may be placed in standby mode to conserve power. In standby mode, the energy storage circuit may be used to power circuitry that can wake the power converter from standby when appropriate. The power converter circuit can be provided as part of a stand-alone power adapter or may be incorporated into other electronic devices.

The power converter circuit may have control circuitry that controls a switch to adjust power flow. When the switch is turned off, the power converter circuit is essentially shut down and will not produce a DC power at its output. In this state, which is sometimes referred to as a standby mode or sleep mode, power consumption by the power converter is minimized. When it is desired to power an attached electronic device, the power converter circuit may operate in an active mode in which the switch is actively modulated to produce a desired output signal (e.g., the DC output voltage).

During normal operation, the monitor circuit of the load detection circuit may place the switch that is coupled to the output line in a closed state in which the power converter circuit is coupled to the output line and produces a DC output voltage for powering an electronic device. Periodically, the monitor may open this current detection switch to isolate the power converter circuit from the output line. The behavior of the voltage on the output line can be monitored by the monitor circuit in the load detection circuit. In the presence of a load that draws power, the output line voltage will tend to sag. When driven by an internal boosting circuit (i.e., the current-limited voltage regulator) with no load present, the output line voltage may rise (or may at least not fall past a given threshold). If the voltage on the output line rises (or does not fall past the given threshold), the monitor circuit can conclude that the electronic device is detached from the power converter. If the voltage on the output line falls (or falls past the given threshold), the monitor can conclude that the electronic device is attached to the power converter.

The power converter circuit can use the current sensing resistor to make a current measurement before opening the switch. If the current sensing resistor indicates that there is a current flowing through the electronic device, opening of the switch to make further current measurements may be inhibited.

The power converter may include an energy storage element such as a capacitor or battery. When the power converter circuit is operating in standby mode, the monitor circuit can draw power from the energy storage element. This allows the monitor circuit to actively monitor the state of the output line to automatically determine when an electronic device is reattached to the power converter. The monitor circuit may also monitor the status of the energy storage element. If the energy storage element becomes depleted, the monitor circuit can direct the power converter circuit to momentarily transition from the standby mode of operation to the active mode of operation to replenish the energy storage element. If a drop in the output line voltage or other activity is detected that is indicative of reattachment of the electronic device to the power converter, the monitor circuit may activate the power converter circuit so that the electronic device is powered.

Further features of the invention, its nature and various advantages will be more apparent from the accompanying drawings and the following detailed description of the preferred embodiments.

DETAILED DESCRIPTION

Circuits that handle power signals are often connected to loads. When a load is coupled to a circuit that is handling power signals, power can flow from the circuit through the load. As an example, a power converter may supply power to an electronic device. The internal circuitry and battery of the electronic device may consume the supplied power. As another example, power signals can be supplied to a portion of the circuitry in a system (e.g., circuitry on a printed circuit board or within an integrated circuit). In this type of situation, some or all of the circuitry on the printed circuit board or in the integrated circuit may serve as a load. Devices without batteries such as certain headsets and adapters may also serve as loads.

Load detection capabilities can be incorporated into the circuitry that is being used to handle the power signals. For example, load detection circuitry can be incorporated into a power converter or other circuit. The load detection circuit can be used to monitor the load. By monitoring the load, the load detection circuit can determine whether the load is connected to circuit. In some situations, the load detection circuit can also make power consumption measurements (e.g., current measurements).

Once the load detection circuit has determined whether or not the load is attached and has made any desired power consumption measurements, appropriate actions can be taken. For example, the circuitry in which the load detection circuitry is included can be placed in a low power sleep state when the load is not attached and can be placed in normal operating mode when the load is attached. As another example, the circuitry in which the load detection circuitry is included can store power consumption measurements in a log. Alerts can be issued if power consumption levels exceed predetermined limits. If desired, circuits can be switched into and out of use and power delivery levels can be adjusted based on the detected characteristics of the load. These are merely illustrative examples. Any suitable actions can be taken based on the output of the load detection circuitry if desired.

For clarity, the use of load detection circuitry is sometimes described in connection with power converters. This is merely illustrative. Any suitable circuitry can be provided with load detection circuitry if desired.

Power converters, which are sometimes referred to as power adapters, are used to convert power levels and types. For example, a power converter may be used to boost or reduce a direct-current (DC) power level. Power converters may also be used to convert alternating current (AC) power into DC power. Power converters that are used in converting AC power to DC power are sometimes described herein as an example. In general, however, power converter circuitry may include circuitry for transforming any suitable input signal (e.g., AC or DC currents and voltages) into any suitable output signal (e.g., boosted, reduced, or otherwise transformed AC or DC currents and voltages). The use of power converters such as AC-to-DC power converters that produce regulated DC output voltages from AC input signals is merely illustrative.

In a typical scenario, a power converter may be plugged into a source of AC line power such as a wall outlet. The AC power source may provide power at 120 volts or 240 volts (as examples). Circuitry in the power converter may convert the AC line power that is received into DC power. For example, an AC to DC power converter may receive AC line power at an input and may supply DC power at a corresponding output. The output voltage level may be 12 volts, 5 volts, or any other suitable DC output level.

The circuitry in the power converter may be based on a switched mode power supply architecture. Switched mode power supplies use switches such as metal-oxide-semiconductor power transistors and associated control schemes such as pulse-width modulation control schemes or frequency modulation control schemes to implement power conversion functions in relatively compact circuits. When the switching circuitry has a first configuration, power is transferred from a power source to a storage element such as an inductor (e.g., a transformer) or a capacitor. When the switching circuitry has a second configuration, power is released from the storage element into a load. Feedback may be used to regulate the power transfer operation and thereby ensure that the output voltage is maintained at a desired level. Examples of switched mode power supply topologies that may be used in a power converter include buck converters, boost converters, flyback converters, etc.

With one suitable arrangement, which is described herein as an example, an AC to DC power converter may be implemented using a voltage rectifier and flyback converter. The voltage rectifier converts AC line power into DC power at a relatively high voltage level. The flyback converter portion of the power converter steps down the DC power at the output of the rectifier circuit to 12 volts, 5 volts, or other suitably low level for operating circuitry in an electronic device. If desired, other power converter architectures may be used. The use of a switched mode power converter arrangement that is based on a flyback converter design is described herein as an example.

An AC to DC power converter or other circuit that includes load detection circuitry may supply DC power to any suitable load. As an example, an electronic device may receive the DC power. Examples of an electronic device that may receive DC power from an AC to DC power converter or other power circuit include a handheld computer, a miniature or wearable device, a portable computer, a desktop computer, a router, an access point, a backup storage device with wireless communications capabilities, a mobile telephone, a music player, a remote control, a global positioning system device, and a device that combines the functions of one or more of these devices. With one suitable arrangement, which is sometimes described herein as an example, the electronic device that receives power from the AC to DC converter is a compact portable device such as a handheld electronic device (e.g., a mobile telephone or music player). This is, however, merely illustrative. The AC to DC power converter may be operated in conjunction with any suitable electronic device or any other load.

Figure 1:
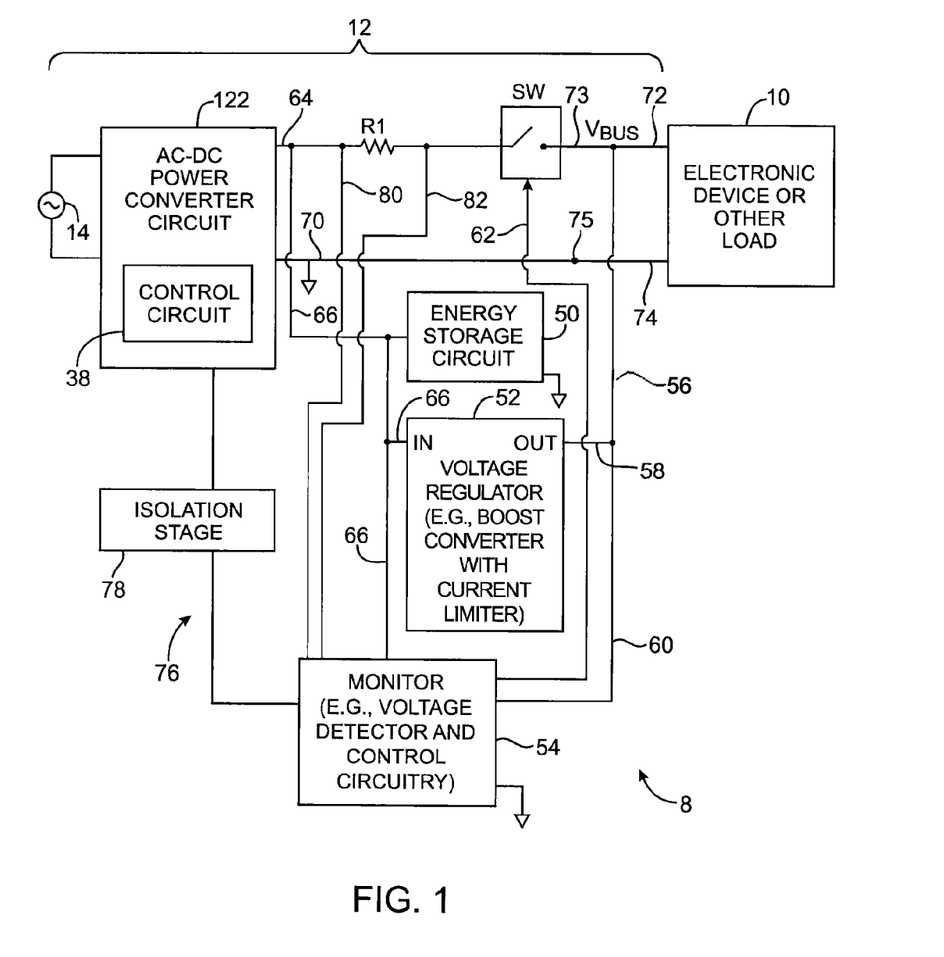
FIG. 1 is a circuit diagram of a system including a power converter with a multirange load detector circuit and an electronic device or other load that is connected to the power converter in accordance with an embodiment of the present invention.

An illustrative system environment in which a circuit such as a power converter or other circuit that handles power signals may provide power to an electronic device or other load is shown in FIG. 1. As shown in FIG. 1, system 8 may include a source of AC power such as AC power source 14, a power converter such as AC to DC power converter 12, and an electronic device or other suitable load such as electronic device 10.

AC power source 14 may be, for example, a standard wall outlet that supplies AC line power via a power cord. Wall outlet power is typically delivered at AC voltages of about 110 volts to 240 volts.

Power converter 12 may include a power converter circuit such as AC-DC power converter circuit 122. AC-DC power converter circuit 122 may be based on a switched-mode power supply design such as a flyback converter or other suitable power converter topology.

Electronic device 10 may have a battery for use in powering device 10 when unattached to power converter 12. When power converter 12 is plugged into AC power source 14 and when electronic device 10 is connected to power converter 12, power converter 12 can transform AC power that is received from AC power source 14 into DC power for device 10.

If desired, connectors may be provided at the input and/or output of power converter 12. For example, device 10 may have a universal serial bus (USB) port into which a USB cable may be plugged. The USB cable may be used to convey DC power between power converter 12 and electronic device 10. For example, the USB cable or other cable may contain a first line such as positive power supply line 72 that is used to convey a positive DC voltage at 12 volts, 5 volts, or other suitable positive DC voltage level from converter 12 to device 10. This DC voltage level is sometimes referred to as Vbus and line 73 of converter 12 is sometimes referred to as a power supply bus or output line. The USB cable or other cable may also have a second line such as ground line 74 that is used to convey a ground voltage at 0 volts or other suitable ground voltage level from ground line 75 to device 10. A cable such as a USB cable may also contain data lines that may optionally be used to convey information between device 10 and converter 12.

When connected to power converter 12, electronic device 10 may receive DC power through the power pins of the USB connector and cable (as an example). The use of a USB connector to connect power converter 12 and electronic device 10 is, however, merely illustrative. Any suitable plugs, jacks, ports, pins, other connectors, or a hardwired connection may be used to interconnect power converter 12 and electronic device 10 if desired. Similarly, a hardwired connection or a suitable plug, jack, port, pin structure, or other connector may be used to connect power converter 12 to power source 14.

AC-DC power converter circuit 122 may convert AC power from AC source 14 to DC power on output paths 64 and 70. Path 64 may be a positive power supply line that is coupled to converter output line 73 via series-connected current sensing resistor R1 and switch SW. During operation, current may flow across resistor R1, leading to a measurable voltage drop across lines 80 and 82. The magnitude of the voltage across resistor R1 may be measured using monitor circuit 54 (e.g., using a voltage detector in monitor circuit 54 that is coupled between lines 80 and 82). Because the magnitude of R1 may be determined in advance, measurement of the voltage across resistor R1 can be used to determine the amount of current flowing through line 64 (using Ohm's law). This calculation may be made by monitor 54 or other circuitry in converter 12.

Voltage path 70 may be a ground power supply line that is coupled to ground output 75 of converter 12 and ground line 74 in the cable or other path connecting converter 12 to device 10. Switching circuitry such as switch SW may be based on any suitable electrical components that can control the flow of DC power from the output of AC-DC power converter circuit 122 to the power supply input lines associated with electronic device 10 (e.g., the inputs of device 10 that are connected to power supply lines 72 and 74). For example, switch SW may be implemented using one or more transistors such as one or more power field-effect transistors (power FETs). During normal operation in which an electronic device such as electronic device 10 is connected to power converter 12, power converter 12 may use AC-DC power converter circuit 122 to supply a DC power supply voltage on lines 64 and 70. Switching circuitry SW will generally be closed during normal operation, so line 64 will be shorted to output line 73. This allows the DC power supply voltages at the output of AC-DC power converter circuit 122 to be provided to electronic device via paths 72 and 74.

AC-DC power converter circuit 122 may contain control circuitry 38 for controlling internal switching circuits (e.g., transistor-based switches). The control circuitry may be responsive to feedback signals. For example, a feedback path that is formed using line 60, monitor 54, and isolation stage 78 may be used to supply AC-DC power converter circuit 122 with information on the current level of voltage Vbus on output line 73. In response to this feedback information, the control circuitry in AC-DC power converter circuit 122 (i.e., control circuitry 38) can make real-time adjustments to the amount of DC voltage that is being supplied to the output of AC-DC power converter circuit. For example, if the DC voltage on output 64 has a nominal value Vsec of 5 volts and feedback indicates that the voltage has undesirably risen to 5.05 volts, the control circuitry in AC-DC power converter circuit 122 can make adjustments to lower the DC output voltage back to the nominal value (Vsec).

Power converter 12 may contain an energy storage circuit 50. Energy storage circuit 50 (sometimes also referred to as an energy storage element) may be based on any suitable circuitry for storing energy. As an example, energy storage circuit 50 may include one or more batteries, capacitors, etc. During operation of power converter 12 when AC-DC power converter circuit 122 is supplying power to output path 64, a path such as path 66 may be used to route power to energy storage circuit 50. The power that is routed to energy storage circuit 50 in this way may be used to replenish the battery, capacitor or other energy storage components in circuit 50. In the example of FIG. 1, energy storage circuit 50 is coupled to AC-DC power converter circuit 122 by paths 64 and 66. This is, however, merely illustrative. Any suitable routing paths may be used to supply replenishing power from AC-DC power converter circuit 122 to energy storage circuit 50 if desired.

As shown in FIG. 1, power converter 12 may include monitoring circuitry such as monitor circuit 54. Monitor 54 may monitor the status of power converter 12 using paths such as paths 80, 82, 66, and 60. When appropriate, monitor 54 may provide control signals to AC-DC power converter circuit 122 using paths such as path 76.

An isolation element such as isolation stage 78 may be interposed in path 76. The control signals that are provided over path 76 may be used to direct control circuitry 38 to make adjustments to the operation of converter circuit 122 (e.g., to increase or decrease the output voltage on line 64 and/or to place AC-DC power converter circuit in an appropriate operating mode). In general, any suitable number of operating modes may be supported by AC-DC power converter circuit 122 if desired.

With one suitable arrangement, which is sometimes described herein as an example, AC-DC power converter circuit 122 may be placed in an active mode and a standby mode. In the active mode, which is sometimes also referred to as a high-power mode or normal operating mode, AC-DC power converter 122 is on and supplies DC output power for replenishing energy storage circuit 50 and for powering electronic device 10. In the standby mode, which is sometimes referred to as a sleep mode or low-power mode, AC-DC power converter circuit 122 is placed in a state in which little or no power is consumed by AC-DC power converter circuit 122 (i.e., AC-DC power converter circuit 122 is turned off by inhibiting modulation of its switched-mode power supply switches). If desired, AC-DC power converter circuit 122 may have multiple lower power states (e.g., a partly off state and a fully-off state). Arrangements in which AC-DC power converter 122 is placed in either a standby state or an active state are sometimes described herein as an example. This is, however, merely illustrative. Power converter 12 may, in general, support any suitable number of operating modes (e.g., a fully-on mode, a partly-on mode, a sleep mode, a deep sleep mode, etc.).

When AC-DC power converter circuit 122 is in standby mode, AC-DC power converter circuit 122 is off and allows output 64 to float. In this situation, the power that has been stored in energy storage circuit 50 may be delivered to path 66 from within energy storage circuit 50. For example, if energy storage circuit 50 contains a battery or a capacitor, the battery or capacitor may be used to supply a battery or capacitor voltage to path 66. The voltage supplied by energy storage circuit 50 may be supplied at the same voltage level as the nominal output voltage level (Vsec) that AC-DC power converter circuit 122 supplies to path 64 when AC-DC power converter circuit 122 is in active mode.

Voltage regulator 52 may receive the voltage supplied by energy storage circuit 50 via path 66 on its input IN and may supply a corresponding output voltage to output path 58 via its output OUT. In the absence of a load on output line 73, the voltage that voltage regulator 52 supplies to path 58 may be elevated with respect to Vsec (i.e., the voltage supplied by voltage regulator 52 to path 58 during standby operations may be equal to an elevated voltage Vaux that is larger than Vsec). If, for example, Vsec is 5.0 volts (as an example), Vaux may be 5.1 volts (as an example).

Output line 58 may be coupled to output line 73 and path 72. During standby mode, monitor 54 may supply a switch control signal to switching circuitry SW via a path such as path 62. The control signal may place SW in an open mode in which lines 64 and 73 are electrically disconnected from each other. Disconnecting output line 73 from path 64 isolates output 73 from AC-DC power converter circuit 122 and energy storage circuit 50. The voltage that output line 73 assumes following the opening of switching circuitry SW by monitor 54 depends on the status of electronic device 10.

If electronic device 10 is disconnected from power converter 12 when switching circuitry SW opens, voltage regulator 52 will supply elevated voltage Vaux to output line 73 via paths 58 and 56, thereby driving Vbus to Vaux. If electronic device 10 is connected to power converter 12 when monitor 54 opens switching circuitry SW, electronic device 10 will operate as a load and will draw power from voltage regulator output OUT via lines 58 and 56. Voltage regulator 52 may contain a current limiting circuit that ensures that voltage regulator 52 will only be able to supply a relatively modest amount of current to electronic device 10. As a result, the power draw from electronic device 10 will pull Vbus low.

Monitor 54 may determine the attachment status of electronic device 10 by monitoring the voltage Vbus on output line 73 via paths 56 and 60. If the monitor detects a rise in voltage Vbus when switching circuitry SW is opened, monitor 54 can conclude that electronic device 10 is currently detached from power converter 12. If monitor 54 detects a drop in voltage Vbus when switching circuitry SW is opened, monitor 54 can conclude that electronic device 10 is currently attached to power converter 12. Whenever monitor 54 determines that electronic device 10 is attached to power converter 12, monitor 54 may place AC-DC power converter circuit 122 in active mode and may close switch SW to supply device 10 with power. If the presence of electronic device 10 is not detected, monitor may leave AC-DC power converter circuit in standby mode to conserve power. If monitor 54 detects that energy storage circuit 50 has become depleted due to prolonged operation in standby mode, monitor 54 may awaken AC-DC power converter circuit 122 momentarily to replenish energy storage circuit 50.

During active mode, monitor 54 may use monitor 54 to determine whether a load is connected to lines 72 and 74. Relatively large currents can be detected using current sensing resistor R1 without opening switch SW. Smaller currents can be detected by periodically opening switch SW while monitoring voltage Vbus using monitor 52. To prevent undesired excessive changes in voltage Vbus during the periodic opening of switch SW, monitor 54 may use the current sensing resistor R1 to test for the presence of a large load current before each scheduled opening of switch SW. If a large load current is detected, monitor 54 may inhibit the opening of switch SW (i.e., the periodic opening of switch SW can be interrupted so long as current is detected using resistor R1).

Figure 2:
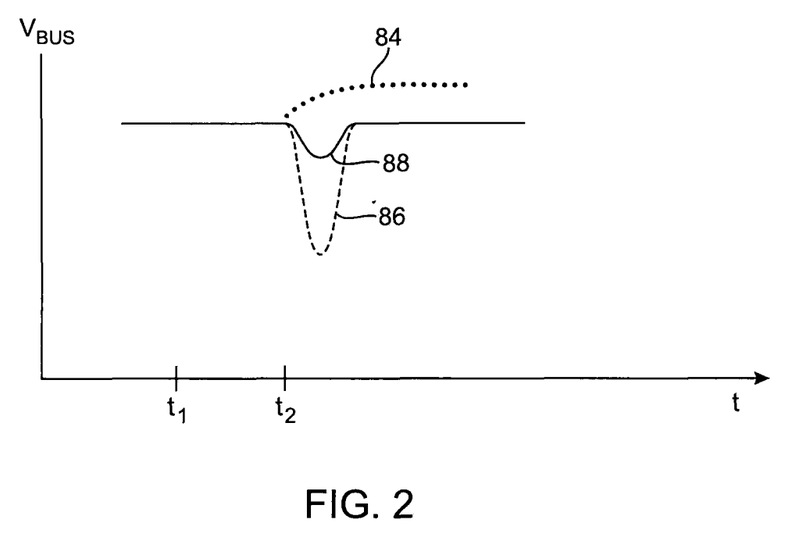
FIG. 2 is a graph showing how the output voltage from a power converter of the type shown in FIG. 1 may evolve under various conditions in accordance with an embodiment of the present invention.

The graph of FIG. 2 shows how the voltage Vbus may evolve in different situations when switch SW is opened. As shown in FIG. 2, the voltage on Vbus is initially constant (time t1). If switch SW is opened at time t2, power delivery from AC-DC power converter circuit 122 will be interrupted. Voltage regulator 52 (e.g., a current limited boost circuit) may supply a voltage on line 56 that is elevated with respect to the nominal output voltage from converter 122. When switch SW is opened and no load is present, this elevated voltage will cause the voltage Vbus to rise, as shown by dotted line 84. Monitor 54 can detect this rise and thereby conclude that no load is present.

If Vbus drops when switch SW is opened, monitor 54 can detect the corresponding drop in voltage Vbus and can conclude that a load is connected to lines 72 and 74. In some situations, there may be a large load current flowing through device 10. For example, if a battery in device 10 is being charged or another load with a relatively high power demand is presented across the output of converter 12, a current of 1-2 amps or more may flow through the load. If a relatively large load current is flowing and/or if switch SW is opened for a relatively long amount of time due to propagation delays, the voltage Vbus may drop excessively during the time period that SW is open. This potential for an excessive drop in voltage Vbus is illustrated by dashed line 86 in FIG. 2. If Vbus drops excessively, device 10 may experience an undesirable lockup or other undesired or unintended operations may result. It is therefore generally desirable to limit the amount by which voltage Vbus can drop during an open switch condition for switch SW (e.g., to a voltage drop of the type illustrated by solid line 88 of FIG. 2).

One way to ensure that voltage Vbus drops no more than shown by line 88 is to use a high-speed transistor and control circuit for switch SW. Although this approach can be satisfactory in some circumstances, excessive demands on the speed of switch SW can be costly to implement. Moreover, the use of a short "open" time for switch SW may make it difficult to discriminate between low-load and no-load conditions.

By using current sense resistor R1 to perform high current detection operations, the use of switch SW and voltage regulator 52 can be reserved for use in low current detection operations. This type of arrangement involves making initial (coarse) load current measurements using resistor R1 and monitor 54 (e.g., at time t1). Only if it is determined that no coarse currents (e.g., 1-2 amp currents or more) are flowing through the load are more sensitive current sensing techniques (i.e., techniques involving the opening of switch SW) used.

The ability to determine whether large load currents are flowing through lines 64 and 70 before opening switch SW may help avoid the need to implement switch SW with a fast transistor and drive circuit. Once it has been determined that no large load currents are being drawn, the presence or absence of smaller load currents can be investigated by opening switch SW and monitoring the resulting change in voltage Vbus. If no load is connected to lines 72 and 74, this subsequent opening of switch SW will cause Vbus to rise, because Vbus is being driven high by the output of current limited boost circuit 52. If a load is present, the opening of a switch SW will disconnect Vbus from the output of AC-DC power converter circuit. The output of voltage regulator circuit 52 is current limited, so the load current from device 10 will pull Vbus low. Because the load has been pre-tested using resistor R1, high-current situations that could result in a voltage drop of the type shown by dashed line 86 will be avoided (i.e., the voltage drop will appear as depicted by solid line 88).

Load detection circuits of this type in which load currents in multiple different ranges are sensed are sometimes referred to herein as multirange load detection circuits. In the FIG. 1 example, high-range load currents are detected by resistor R1 and monitor 54 and low-range load currents are detected using monitor 54, switch SW, and current limited voltage regulator 52. Other arrangements may be used if desired. For example, a multirange load detection circuit can be implemented using three or more load-current-detection ranges, a multirange load detection circuit can be implemented using current sensors of different types, etc.

Figure 3:
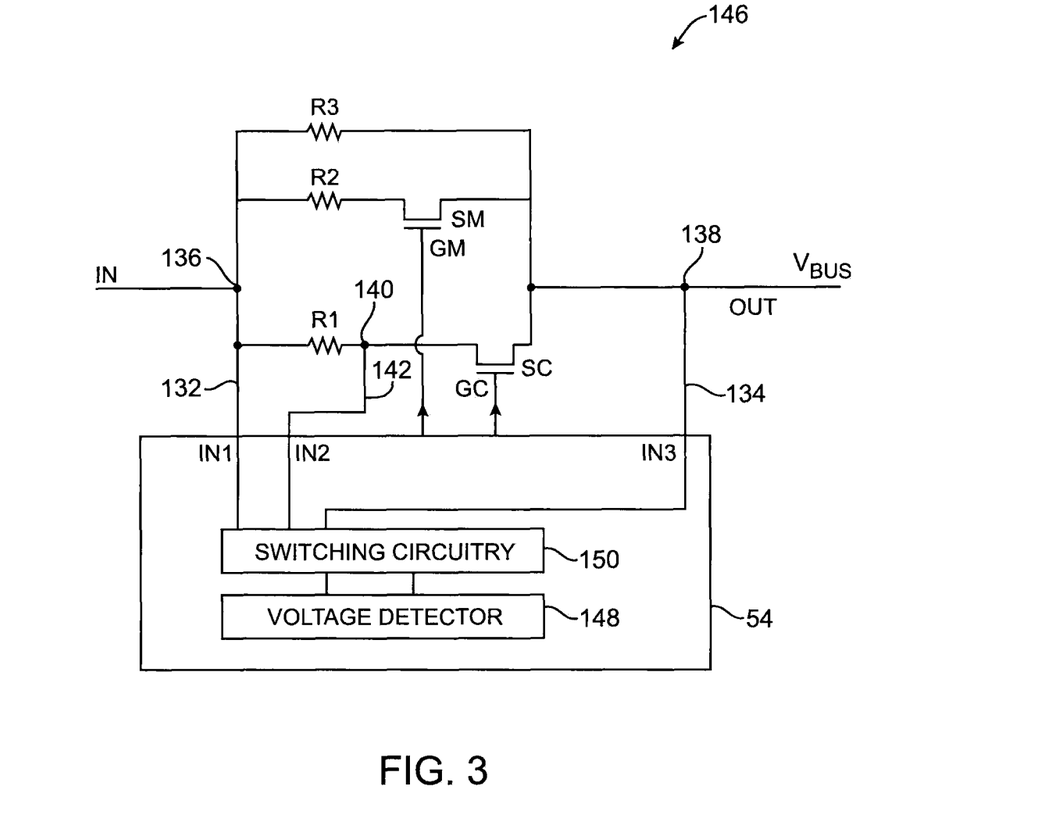
FIG. 3 is a circuit diagram of an illustrative multirange load detection circuit based on three current sensing resistors of different sizes in accordance with an embodiment of the present invention.

An illustrative load detection circuit that is based on three parallel current sensing resistor paths is shown in FIG. 3. As shown in FIG. 3, a power supply signal such as the output voltage on line 64 of converter 12 may be received at input line IN and a corresponding output voltage may be provided for a load at output line OUT.

Control circuitry 54 may measure the current flowing between input IN and output OUT by monitoring the voltage drop across resistors R1, R2, and R3. Switching circuitry such as transistors SC and SM may be used to selectively route load current through R1, R2, or R3. Resistors R1, R2, and R3 preferably have different magnitudes. For example, resistor R1 may have a resistance that is less than resistor R2. Resistor R2 may have a resistance that is greater than the resistance of resistor R1 and that is less than the resistance of R3. As an example, resistor R1 may have a resistance of 10 milliohms (e.g., less than 1 ohm and more than 0.1 milliohms). Resistor R2 may have a resistance of 1 kilo-ohms (e.g., less than 10 kilo-ohms and more than 0.1 kilo-ohms and more than ten times greater in resistance than R1), and resistors R3 may have a resistance of 100 kilo-ohms (e.g., less than 10 mega-ohms and more than 10 kilo-ohms and more than ten times greater in resistance than R2). These are merely illustrative values. Any suitable current sensing resistance values may be used in a multirange load detection circuit if desired.

As shown in FIG. 3, load detection circuit 146 may have an associated control circuit such as control circuit 54 (e.g., a circuit such as monitor 54 of FIG. 1). Circuit 54 may include voltage detection circuitry 148 for making voltage measurements across resistors R1, R2, and R3. Voltage measurements may be made at nodes such as nodes 136, 140, and 138 using lines such as lines 132, 142, and 134. For example, the voltage across resistor R1 can be monitored by measuring the voltage across nodes 136 and 140 using lines 132 and 142. When switch SC is closed and switch SM is open, essentially all load current will flow through resistor R1, so the load current can be determined by dividing the voltage drop across R1 by the resistance of R1. More accurate current measurements can be made by accounting for the generally negligible current that flows in resistor R3 in parallel to resistor R1 when switch SC is closed.

Switching circuitry 150 may be used to selectively route signals from inputs IN1, IN2, and IN3 to voltage detector 148. This allows a single voltage detector circuit to be used to measure the voltages across different pairs of nodes in circuit 146.

Each resistor may be used to make a current measurement for a different load current range. When resistor R1 is smaller than resistor R2 and resistor R2 is smaller than resistor R3, resistor R1 may be used to measure the largest load currents, resistor R2 may be used to measure intermediate load currents, and resistor R3 may be used to measure load currents that are smaller than those measured using resistor R2.

Transistors SC and SM can be controlled by control circuit 54 using control signals applied to gates GC and GM. When it is desired to make a high-range load current measurement, switch SC can be closed by taking GC high and switch SM can be opened by taking GM low. When it is desired to make load current measurements in the intermediate range, switch SC can be opened by taking the control signal for gate GC low and switch SM can be closed by taking the control signal for gate GM high. When two resistors are switched into use in parallel, the load current will effectively flow entirely through the lower resistance resistor. The load current can therefore be computed by neglecting the small amount of current that flows through the higher resistance resistor. If desired, more accurate current measurements may be made by taking account of currents flowing through the high-resistance paths.

The example of FIG. 3 involves the use of three different current sensing resistors. If desired, more than three resistors may be used. Moreover, one, two, three, or more than three current sensing resistors may be used in circuits that use a boost circuit and switch arrangement of the type described in connection with FIG. 1 to make load current measurements.

Figure 4:
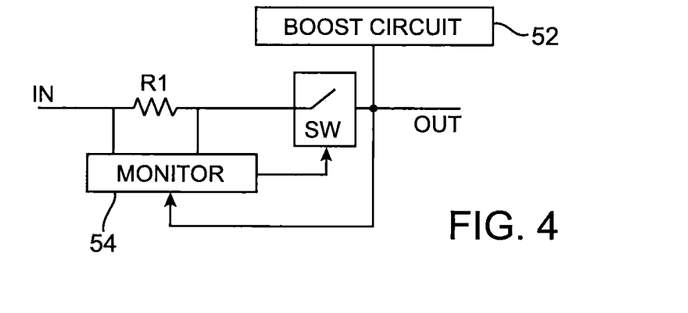
FIG. 4 is a circuit diagram of an illustrative multirange load detection circuit based on a current sensing resistor and a switch and boost circuit arrangement in accordance with an embodiment of the present invention.

FIG. 4 is a circuit diagram of an illustrative load detection circuit in which a single current sensing resistor (resistor R1) is used to detect high load currents while a boost circuit or other current-limited voltage regulator (boost circuit 52), switch (switch SW), and monitor (monitor 54) are used to detect low load currents as described in connection with FIGS. 1 and 2.

Figure 5:
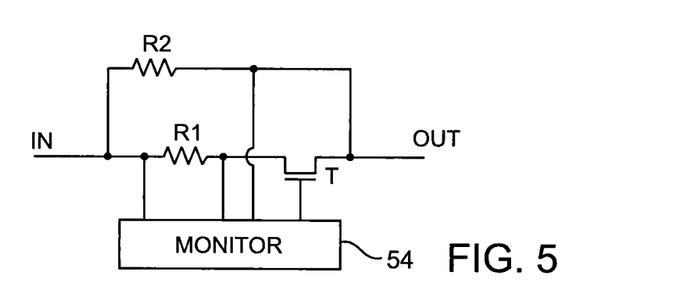
FIG. 5 is a circuit diagram of an illustrative multirange load detection circuit based on a two current sensing resistors of different sizes in accordance with an embodiment of the present invention.

FIG. 5 is a circuit diagram of an illustrative load detection circuit based on two different current sensing resistors. High load current measurements may be made by closing transistor T and measuring the voltage drop across small resistor R1. Low load current measurements may be made by opening transistor T and measuring the voltage drop across resistor R2.

Figure 6:
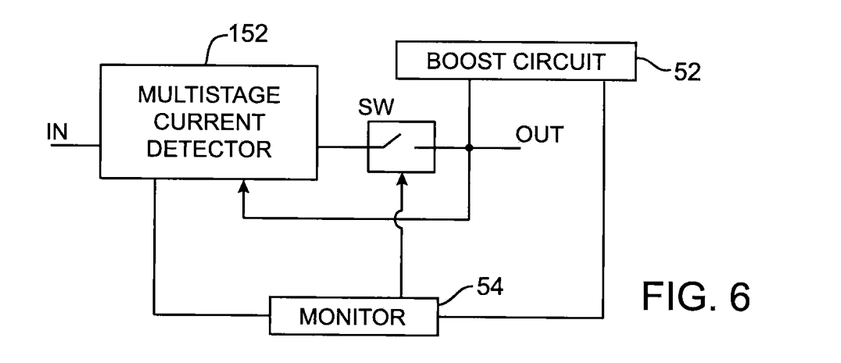
FIG. 6 is a circuit diagram of an illustrative multirange load detection circuit that includes a multistage current detector based on two or more current sensing resistors and that includes a switch and boost circuit arrangement in accordance with an embodiment of the present invention.

As shown in the example of FIG. 6, a load detection circuit may have a multistage current detector such as multistage current detector 152 that is used to make high range load current measurements and a boost circuit or other voltage regulator (boost circuit 52), switch (switch SW), and monitor (monitor 54) that are used to detect low load currents as described in connection with FIGS. 1 and 2. Multistage current detector 152 may be based on one current sensing resistor (e.g., as shown in FIG. 4), on two current sensing resistors (e.g., as shown in FIG. 5), on three current sensing resistors (e.g., as shown in FIG. 3), or more than three current sensing resistors.

Figure 7:
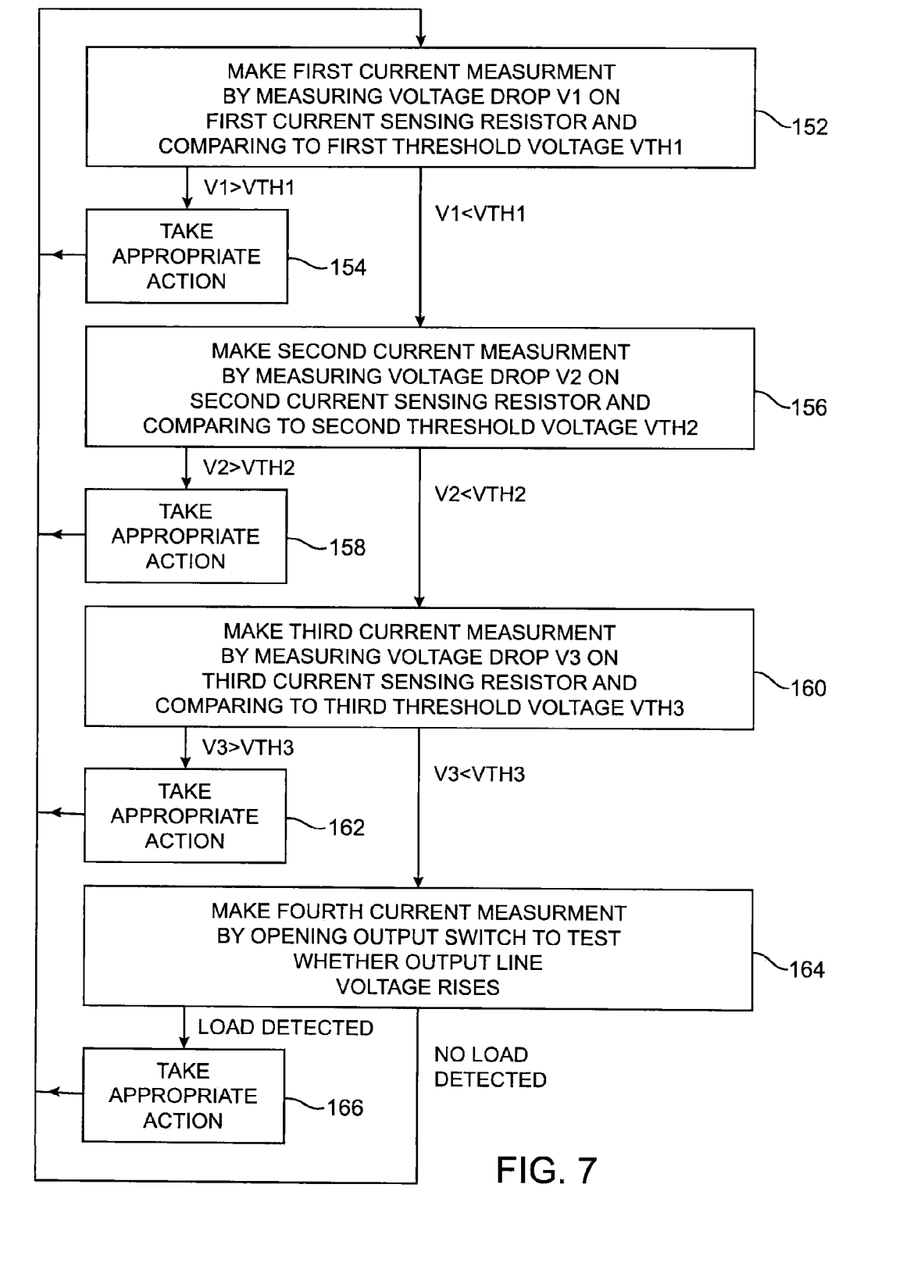
FIG. 7 is a flow chart of illustrative operations that may be involved in operating a system of the type shown in FIG. 1 that incorporates a multirange load detection circuit in accordance with an embodiment of the present invention.

Illustrative steps involved in using a multirange load detection circuit to make load current measurements are shown in FIG. 7. In the example of FIG. 7, the multirange load detection circuit that is being used has three current sense stages (e.g., as shown in FIG. 3) that are used to make large, medium, and small load current measurements and has a load current measurement stage based on a boost circuit and switch that is used to make even smaller load current measurements. This is, however, merely illustrative. Load current measurements may be made using any suitable load detection circuitry (e.g., the examples of FIGS. 3, 4, 5, and 6 and other suitable load detection circuits).

At step 152, a first load current measurement may be made by measuring a first voltage drop V1. This voltage drop may be measured over small resistor R1 (see, e.g., FIG. 3). Monitor 54 may compare the voltage drop V1 to a first (high-range) voltage threshold VT1. If V1 is greater than VT1, the monitor may conclude that the load current is more than a first level (i.e., Iload is greater than I1). An action appropriate for this level of load current may then be taken (step 154) and processing may return to step 152. During the operations of step 154, any suitable actions may be taken by converter 12 or other circuit in which the load detection circuitry is being used. Examples of actions that may be taken include generating audible or visible alerts, creating digital output signals, logging the magnitude of I1 in a database or other storage device for later retrieval, turning on or off circuitry in converter 12, etc. (Actions such as these may also be performed at steps 158, 162, and 166.)

If it is determined that V1 is less than VTH1, it can be concluded that the load current (if any) is less than I1 and processing can continue to step 156. During the operations of step 156, the second current sensing resistor (e.g., R2) can be used to make an intermediate-level load current measurement. In particular, the switches of the multirange load current detector may be adjusted to route load current through resistor R2 while the voltage across resistor R2 is measured to determine the load current. If the measured voltage V2 is greater than a second threshold voltage VTH2, it can be concluded that the load current is greater than I2 (i.e., I1>Iload>I2). Appropriate action can then be taken at step 158. If, however, the measured voltage V2 is less than the second threshold voltage VTH2 (VTH2 and the other voltage thresholds of FIG. 8 may be the same as VTH1 or may be different), it can be concluded that the load current (if any) is less than I2 and processing can continue at step 160.

The operations of step 160 involve making load current measurements using resistor R3 (see, e.g., FIG. 3). If the resulting voltage drop V3 across resistor R3 is greater than a third threshold voltage VTH3, it can be concluded that the load current Iload has a value between I2 and I3 (where I1 is a high-range load current, I2 is an intermediate-range load current, and I3 is less than I1 and I2) and appropriate action can be taken at step 162. If, however, V3 is less than VTH3, it can be concluded that the load current (if any) is less than I3. Processing can then continue to step 164.

During the operations of step 164, switch SW can be opened to determine whether the voltage Vbus will rise (indicating that no load is detected) or will fall. If Vbus falls when switch SW is opened, appropriate action can be taken at step 166.

The use of multiple stages of current-sensing resistor to make progressively lower load current measurements of the type described in connection with FIG. 7 may help ensure that the voltage Vbus never is pulled too low when switch SW is opened. Moreover, the detected load current ranges may be stored in a log for subsequent analysis or can be used to take other appropriate actions in real time. In circuits other than power converter circuits, load current measurements may be used to control circuit operation, to gather load current data for trend analysis, to monitor load activity for generating alerts, or to support any other suitable activity.

Figure 8:
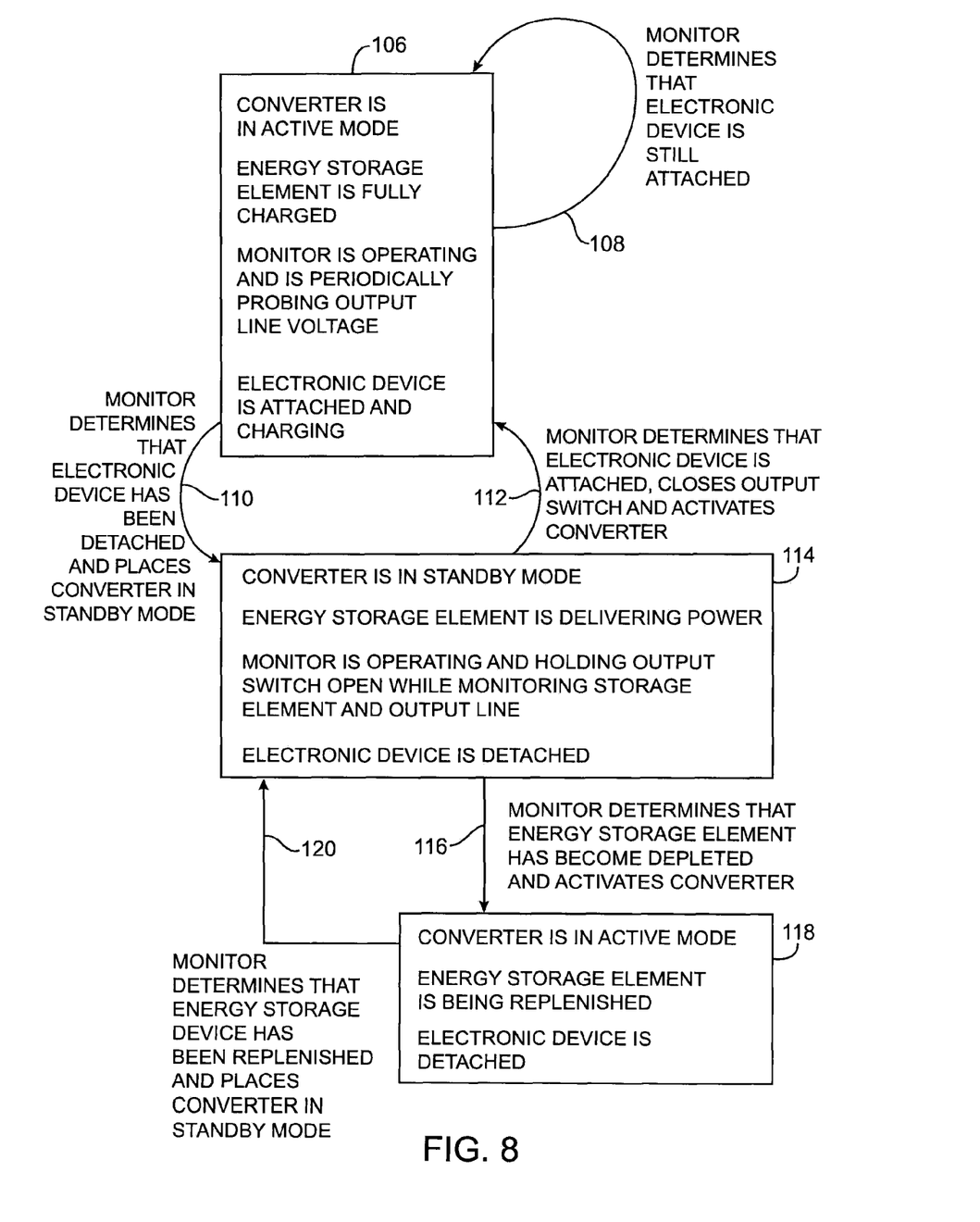
FIG. 8 is a diagram showing illustrative operating modes and operations involved in transitioning between operating modes in a power converter of the type shown in FIG. 1 that is using a multirange load detection circuit in accordance with an embodiment of the present invention.

In power converter circuits, the multistage load current detection circuit may be used to control whether the power converter is in a sleep mode or is in an active mode (as an example). A diagram illustrating how multistage load current detection circuitry of the type described in connection with FIGS. 1-7 may be used in a power converter such as power converter 12 of FIG. 1 is shown in FIG. 8. During the operations of FIG. 8, a user may attach and detach a load from converter 12. For example, a user of an electronic device such as a media player, computer, or cellular telephone may attach or detach the device from converter 12. Converter 12 can detect these actions and can respond appropriately. The use of a multirange load current detector circuit prevents low Vbus conditions that might otherwise arise when opening switch SW to make a load current determination.

As shown in FIG. 8, power converter 12 can operate normally in active mode 106. In active mode 106, power converter 12 acts as an AC-DC power converter and is supplying power to an attached electronic device 10 from AC source 14. In a typical scenario, electronic device 10 contains a rechargeable battery that can be recharged when electronic device 10 is connected to power converter 12. During the operations of mode 106, monitor 54 primarily holds switching circuitry SW closed to allow power to be delivered from line 64 to output line 73 and electronic device 10.

At appropriate times (e.g., once every few seconds, minutes, etc.), monitor 54 measures the load current using current sense resistor R1 (or, if more than one current sense resistor R1 are being used in the multirange detection circuit, successively larger current sense resistors as described, e.g., in connection with FIGS. 3 and 7). If the load current measurement that is performed with the current sense resistor circuitry indicates that a large load current is flowing, switch SW need not be opened to perform additional current measurements (i.e., the opening of switch SW may be inhibited). If, however, the load current measurement that is performed using the current sense resistor indicates that no detectable large load current is flowing, monitor 54 momentarily opens switching circuitry SW to check whether a smaller load current is flowing. If the current sense resistor measurements indicates that a relatively large load current is flowing or if voltage Vbus does not rise when switching circuitry SW is opened (e.g., if voltage Vbus falls below a predetermined threshold voltage), monitor 54 can conclude that electronic device 10 is still attached to power converter 12. As indicated by line 108, the operations of active mode 106 can then continue uninterrupted.

If, however, voltage Vbus rises above a given predetermined threshold when switching circuitry SW is opened, monitor 54 can conclude that device 10 has been detached. As shown by line 110, monitor 54 can then place power converter circuit 122 and power converter 12 in standby mode 114.

During standby mode 114, power converter circuit 122 is not active, so power converter circuit 122 is not able to deliver power for powering monitor 54. Rather, power is supplied from energy storage circuit 50. In particular, energy storage circuit 50 may supply a voltage Vstore to monitor 54. So long as the voltage level of voltage Vstore is sufficient, energy storage circuit 50 can be used to power monitoring circuit 54 and voltage regulator 52. During this time, monitor 54 may periodically check the attachment status of electronic device 10 using the current sense resistor(s) and switch SW. If a load current is detected using the current sensing resistor or if voltage Vbus falls below a given threshold when switch SW is opened during one of these checks, monitor 54 can return power converter circuit 122 and power converter 12 to active mode 106, as indicated by line 112. If monitor 54 determines that the voltage Vstore has fallen sufficiently to warrant replenishment of energy storage element 50, monitor 54 can momentarily activate power converter circuit 122 (active mode 118). In active mode 118, power converter circuit 122 is active and replenishes energy storage element 50 (e.g., by recharging a capacitor or battery in storage element 50 via path 66). Device 10 remains detached during the operations of mode 118.

After the energy in storage element 50 has been restored, monitor 54 may return power converter circuit 122 and power converter 12 to standby mode 114 to conserve power, as indicated by line 120.

If desired, the output of voltage regulator 52 can be provided at a different level (e.g., a level that is greater than the minimum operating voltage of device 10 or other such load but that is not greater than the nominal output voltage Vsec of converter 122). In scenarios in which the output of regulator 52 is not greater than Vsec, the presence of device 10 or other such loads may be detected by determining that the voltage Vbus has not fallen (e.g., Vbus has not fallen past a particular threshold voltage).

The foregoing is merely illustrative of the principles of this invention and various modifications can be made by those skilled in the art without departing from the scope and spirit of the invention.

What is claimed is:

1. A power converter providing a DC voltage through a power converter output, the power converter comprising:
a first stage comprising an AC to DC power converter comprising a first terminal configured to receive an AC line voltage and a second terminal configured to deliver a first DC voltage wherein the second terminal is coupled to a first intermediate node;
a second stage comprising a voltage regulator comprising a third terminal coupled to the first intermediate node and a fourth terminal coupled to a second intermediate node, wherein the second stage is configured to provide a second DC voltage with a limited amount of current to the second intermediate node through the fourth terminal;
a switch disposed between the first intermediate node and the second intermediate node;
an energy storage device coupled to the first intermediate node and configured to store energy from and deliver energy to the first intermediate node; and
a control circuit configured to operate the first stage and the switch,
whereby the second intermediate node is coupled to the first intermediate node by the switch when the first stage is in an active state and the first and second stages provide power to the second intermediate node,
whereby the second intermediate node is isolated from the first intermediate node by the switch when the first stage is in a standby state and only the second stage provides power to the second intermediate node,
wherein the second intermediate node is coupled to the power converter output.

2. The power converter of claim 1, wherein the control circuit is configured to put the first stage in the standby state when the output voltage of the power converter rises.

3. The power converter of claim 2, wherein the energy storage device is configured to provide stored energy to the second stage when the first stage is in the standby state.

4. The power converter of claim 3, wherein the control circuit is configured to transition the first stage from the standby state to the active state when the stored energy in the energy storage device is less than a stored energy threshold.

5. The power converter of claim 1, wherein the control circuit is further configured to configure the switch to couple the first intermediate node to the second intermediate node when a load current is less than a first load current threshold and greater than a second load current threshold.

6. The power converter of claim 1, wherein the control circuit is configured to determine output load status by monitoring a voltage of the second intermediate node when the first stage is in a standby state.

7. A power converter for converting an AC line voltage to a DC voltage, the converter comprising:
- an AC to DC converter stage comprising a first terminal coupled to the AC line voltage and a second terminal coupled to a first intermediate node, wherein the AC to DC converter stage is configured to provide a DC voltage to the second terminal;
- a current sensing resistor comprising a first resistor terminal coupled to the first intermediate node and a second resistor terminal coupled to a second intermediate node;
- a voltage regulator stage comprising a third terminal coupled to first intermediate node and a fourth terminal coupled to the second intermediate node, wherein the voltage regulator stage is configured to receive power from the third terminal and provide a limited amount of current to the fourth terminal; and
- a controller coupled to the first intermediate node, the first and the second resistor terminals of the current sensing resistor and the second intermediate node, the controller configured to put the AC to DC converter in a standby mode when a sensed current is less than a predetermined current threshold and allow only the voltage regulator stage to provide output power for the power converter when the AC to DC converter is in the standby mode, wherein the second intermediate node is coupled to an output for the power converter.

8. The power converter of claim 7, further comprising a switch disposed between the second resistor terminal of the current sensing resistor and the second intermediate node, wherein a first switch terminal is coupled to the second resistor terminal of the current sensing resistor and a second switch terminal is coupled to second intermediate node.

9. The power converter of claim 8, wherein the controller is coupled to a control terminal of the switch and is configured to control the state of the switch.

10. The power converter of claim 9, wherein the controller is configured to open the switch when a voltage drop across the current sensing resistor is less than a predetermined amount.

11. The power converter of claim 10, wherein the controller is configured to place the AC to DC converter stage in a standby state when the switch is open.

12. The power converter of claim 7, further comprising an energy storage element coupled to the first intermediate node and configured to provide power to the voltage regulator when the AC to DC converter stage is in a standby state.

13. The power converter of claim 12, further comprising a switch disposed between the second resistor terminal of the current sensing resistor and the second intermediate node wherein a first switch terminal is coupled to the second resistor terminal of the current sensing resistor and a second switch terminal is coupled to the second intermediate node.

* * * * *